(12) United States Patent
Wang et al.

(10) Patent No.: US 9,331,661 B2
(45) Date of Patent: *May 3, 2016

(54) IC EMI FILTER WITH ESD PROTECTION INCORPORATING LC RESONANCE TANKS FOR REJECTION ENHANCEMENT

(71) Applicant: Silergy Semiconductor Technology (Hangzhou) LTD, Hangzhou, ZheJiang Province (CN)

(72) Inventors: Albert Z. Wang, Grand Cayman (KY); Wenchin Wu, Grand Cayman (KY); Shijun Wang, Grand Cayman (KY); Nan Zhang, Grand Cayman (KY)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/486,167

(22) Filed: Sep. 15, 2014

(65) Prior Publication Data

US 2015/0002969 A1     Jan. 1, 2015

Related U.S. Application Data

(63) Continuation of application No. 13/752,978, filed on Jan. 29, 2013, now Pat. No. 8,879,230.

(51) Int. Cl.
  *H01C 7/12*     (2006.01)
  *H03H 7/01*     (2006.01)
  *H02H 9/04*     (2006.01)
  *H01L 23/552*   (2006.01)
  *H03H 1/00*     (2006.01)

(52) U.S. Cl.
  CPC ............. H03H 7/0138 (2013.01); H02H 9/046 (2013.01); *H01L 23/552* (2013.01); *H03H 1/0007* (2013.01)

(58) Field of Classification Search
  USPC .................................................. 361/117–119
  See application file for complete search history.

(56) References Cited

U.S. PATENT DOCUMENTS

| 7,808,752 | B2 | 10/2010 | Richiuso et al. |
| 8,879,230 | B2 * | 11/2014 | Wang et al. .................... 361/118 |
| 2014/0167218 | A1 | 6/2014 | Mallikarjunaswamy et al. |

* cited by examiner

*Primary Examiner* — Danny Nguyen
(74) *Attorney, Agent, or Firm* — Michael C. Stephens, Jr.

(57) ABSTRACT

An integrated circuit (IC) electromagnetic interference (EMI) filter with electrostatic discharge (ESD) protection incorporating inductor-capacitor (LC) resonance tanks is disclosed. The filter comprises at least one circuit composed of a diode and an inductor connected in series, wherein the diode induces a parasitic capacitance and the circuit is grounded. When a number of the circuit is two, a passive element is coupled between the two inductors and cooperates with them to induce two parasitic capacitances connected with the circuits. When a number of the circuit is one, two diodes respectively connect with the inductor through two passive elements. Each diode can induce a parasitic capacitance. The two passive elements and the inductor can induce a parasitic capacitance connected with the circuit.

11 Claims, 10 Drawing Sheets

US 9,331,661 B2

IC EMI FILTER WITH ESD PROTECTION INCORPORATING LC RESONANCE TANKS FOR REJECTION ENHANCEMENT

RELATED APPLICATIONS

This application is a continuation of the following application, U.S. patent application Ser. No. 13/752,978, filed on Jan. 29, 2013, now issued as U.S. Pat. No. 8,879,230, and which is hereby incorporated by reference as if it is set forth in full in this specification.

BACKGROUND OF THE INVENTION

1. Field of the Invention

The present invention relates to an electromagnetic interference (EMI) filter, particularly to an integrated circuit (IC) EMI filter with electrostatic discharge (ESD) protection incorporating inductor-capacitor (LC) resonance tanks for rejection enhancement.

2. Description of the Related Art

Low-pass filter circuit related to this invention is used to block incoming electromagnetic interferers to wireless communication electronic systems, such as a cellular phone. Such a low-pass filter circuit has several critical specifications (specs) to meet the system requirements, including a low pass-band insertion loss (IL), a broad pass-band and high rejection-band attenuation. A low insertion loss for the filter ensures the desired baseband signals passing through with as little energy loss as possible. A broad low pass-band, defined as the frequency bandwidth from direct-current (DC) to a cut-off frequency (i.e., $f_c$) measured at the 3 dB insertion loss point, allows the desired baseband signals with wider frequency spectrum (i.e., lots of useful baseband harmonic signals) to pass through filter. Typically, a wider pass-band (i.e., higher $f_c$) enables higher wireless communication data rates. The rejection-band is determined by the wireless system applications, typically featured from 800 MHz to 6 GHz. The rejection band serves to remove any high-frequency Electromagnetic Disturbance (EMI) interferers, or, noises, which are generally associated with the carrier band frequencies in radio-frequency (RF) systems. To ensure the desired data rates and signal integrity, a −30 dB attenuation in the rejection-band for the EMI interferes is preferred in the EMI filter circuit designs, which means that the noise power must be reduced by a factor of 1000, to ensure the required signal-to-noise ratio (SNR) for the wireless systems. It is well known that a π-shape CLC type filter 10, shown in FIG. 1(a), can theoretically achieve the required low-pass filter function described above. Similarly, a π-shape capacitor-resistor-capacitor (CRC) type LPF circuit 12, as illustrated in FIG. 1(b), can be used to achieve the required filter function. FIG. 2 describes the typical filter insertion loss curve, or, called the forward amplification gain ($S_{21}$) curve characterized in the S-parameter measurement in practical designs. However, in practical filter designs, to achieve the required low insertion loss and broad pass-band, while obtaining high rejection-band attenuation, are in conflict and very challenging, which requires careful filter circuit design trade-off and innovative design techniques. In particular, the $S_{21}$ curve should have a very clean −3 dB cut-off frequency ($f_c$) and a fast roll-off attenuation curve, i.e., a steep $S_{21}$ curvature after the designed $f_c$ point. The conventional CLC filter circuit cannot achieve these requirements due to various integrated circuit (IC) and package parasitic effects. All prior arts may not satisfactory due to the circuit performance and the circuit complexity.

FIG. 1(a) shows the ideal CLC LPF filter circuit schematics, which is a classic third-order filter circuit. The filter circuit can be considered as a typical 2-port network consisting of the port 1 (input) and the port 2 (output) symmetrically. This basic CLC filter consists of two capacitors and one inductor to realize the low-pass filter function. FIG. 3 shows a practical CLC LPF filter circuit schematic including the unavoidable parasitic components and integrated ESD protection diodes. A resistance 14 is the series resistance associated with the conduction channel inductor 16, which causes the insertion loss due to resistive loss. Two inductance 18, one inductance 20 and one resistance 22 model the parasitic inductance and resistance associated with the bonding and package of the filter circuit, respectively. The capacitances 24 can utilize the junction capacitance of the integrated ESD protection diodes 26 (or other ESD protection devices). As shown in the filter schematics, any EMI interferers (i.e., noises) can be filtered out in each direction of the 2-port network. In a typical application scenario as illustrated in FIG. 4, the low-pass filter 28 is placed between the baseband IC chip 30 and the display 32 (e.g., a liquid crystal display, or LCD) port in a Smartphone printed circuit board (PCB). This filter allows the desired baseband signals pass through, while blocking the undesired high-frequency interferers emitted from the noisy LCD module. Some prior arts used fifth-order LC filter circuit and coupled inductors to enhance the filter performance. FIG. 5 depicts typical $S_{21}$ measurement result for a conventional CLC EMI filter circuit corresponding to a conventional filter shown in FIG. 3. It supports a pass-band of about $f_c$=320 MHz wide, good for high data rates up to 120 Mbps. However, the rejection-band attenuation at 800 MHz is only about −23 dB, which is less than the desired −30 dB target.

In view of the problems and shortcomings of the prior art, the present invention provides an integrated circuit (IC) electromagnetic interference (EMI) filter with electrostatic discharge (ESD) protection incorporating inductor-capacitor (LC) resonance tanks, so as to solve the afore-mentioned problems of the prior art.

SUMMARY OF THE INVENTION

The objective of the present invention is to provide an integrated circuit (IC) electromagnetic interference (EMI) filter, which uses a high-order resonating LC tank method and integrates an Electromagnetic Disturbance (EMI) filter in the integrated circuit (IC) format with the required ESD protection components on a chip or within one package to achieve excellent filter circuit performance.

To achieve the abovementioned objectives, the present invention proposes an IC EMI filter with ESD protection incorporating LC resonance tanks. The filter comprises a first diode with a first anode thereof coupled to the ground, and the first diode induces a first parasitic capacitance between a first cathode of the first diode and the first anode. The first cathode is coupled to a first inductor having a first series resistance. The ground is coupled to a second anode of a second diode. The second diode induces a second parasitic capacitance between a second cathode of the second diode and the second anode. The second cathode is coupled to a second inductor having a second series resistance. A first passive element is coupled between the first and second inductors. A first node between the first passive element and the first inductor is coupled to a first port. A second node between the first passive element and the second inductor is coupled to a second port. The first inductor, the second inductor, and the first passive element induce a third parasitic capacitance between the first node and the first anode and a fourth parasitic capacitance between the second node and the second anode.

The present invention proposes another IC EMI filter with ESD protection. The filter comprises a first diode with a first anode thereof coupled to the ground, and the first diode induces a first parasitic capacitance between a first cathode of the first diode and the first anode. The first cathode is coupled to an inductor having a series resistance. The ground is coupled to a second anode of a second diode. The second diode induces a second parasitic capacitance between a second cathode of the second diode and the second anode. The second cathode is coupled to a first port. There is a first passive element coupled between the second cathode and the inductor. The ground is coupled to a third anode of a third diode. The third diode induces a third parasitic capacitance between a third cathode of the third diode and the third anode. The third cathode is coupled to a second port. There is a second passive element coupled between the third cathode and the inductor and cooperating with the first passive element and the inductor to induce a fourth parasitic capacitance between the first anode and a node among the first passive element, the second passive element, and the inductor.

Below, the embodiments are described in detailed in cooperation with the attached drawings to make easily understood the technical contents, characteristics, and accomplishments of the present invention.

DETAILED DESCRIPTION OF THE INVENTION

Figure 1A:
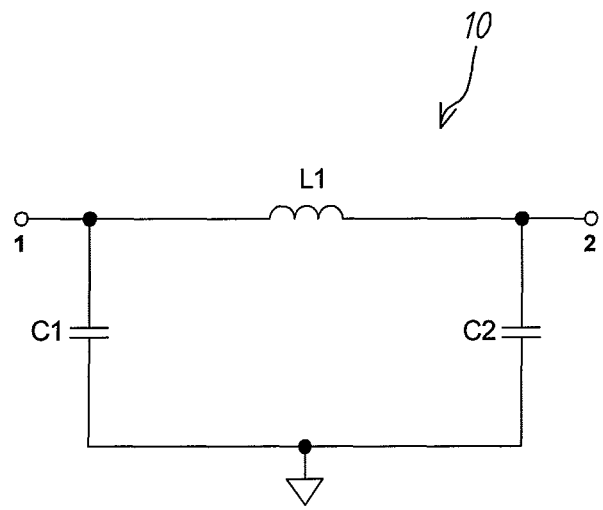
FIG. 1(a) is a diagram schematically showing a traditional CLC type low-pass-filter (LPF) circuit.
Figure 1B:
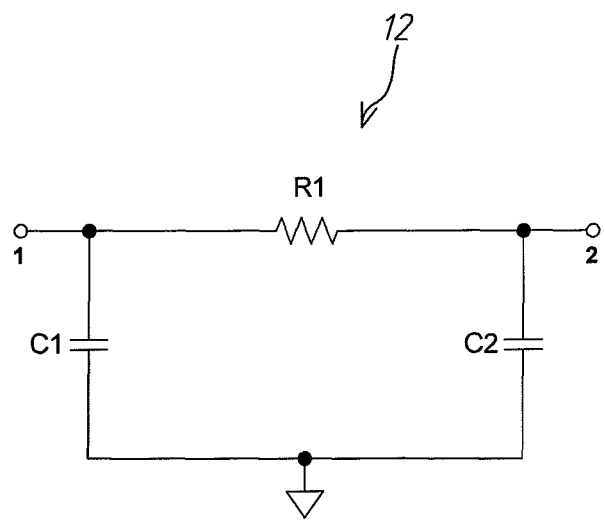
FIG. 1(b) is a diagram schematically showing a traditional CRC type LPF circuit.
Figure 2:
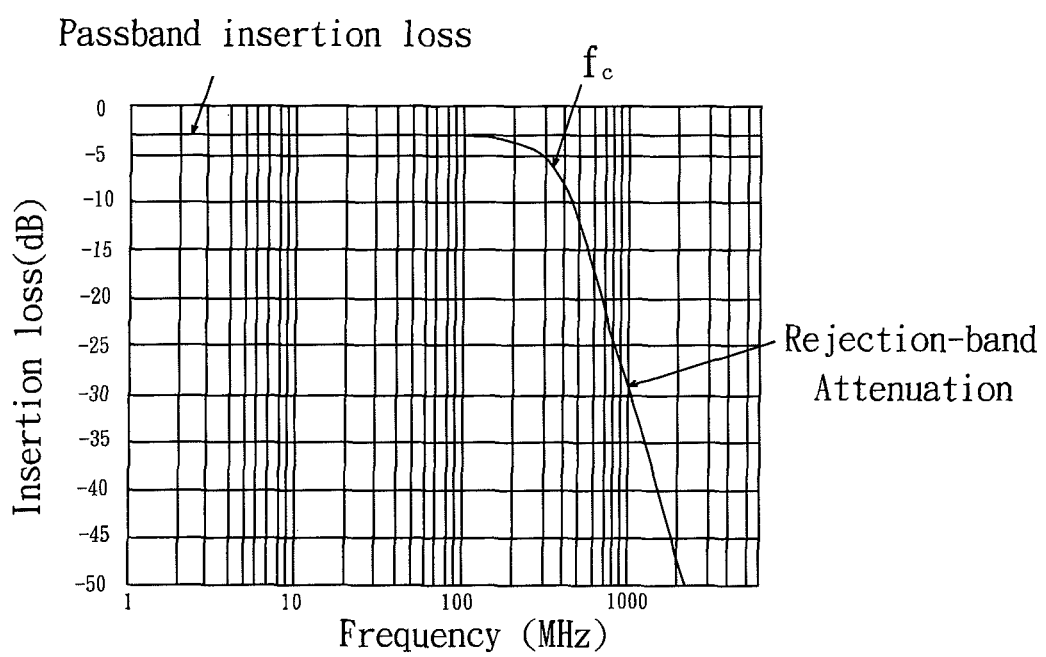
FIG. 2 is a diagram showing the typical filter insertion loss curve of a traditional LPF.
Figure 3:
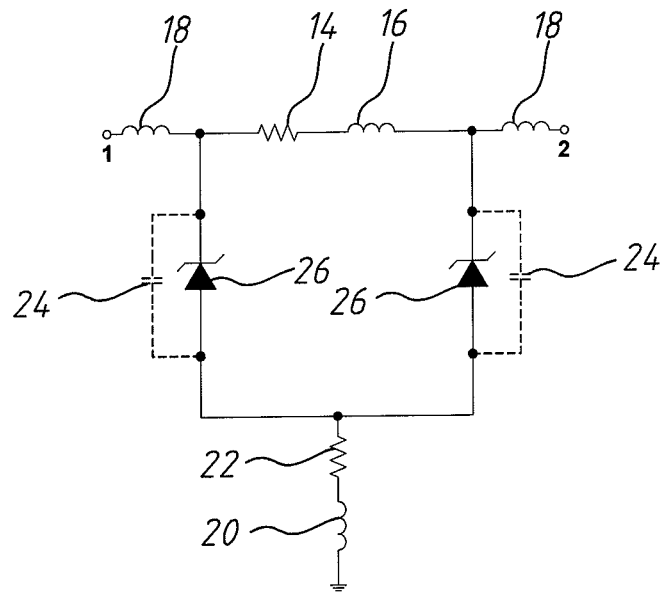
FIG. 3 is a diagram schematically showing a traditional CLC type LPF circuit with integrated electrostatic discharge (ESD) protection diodes in real designs.
Figure 4:
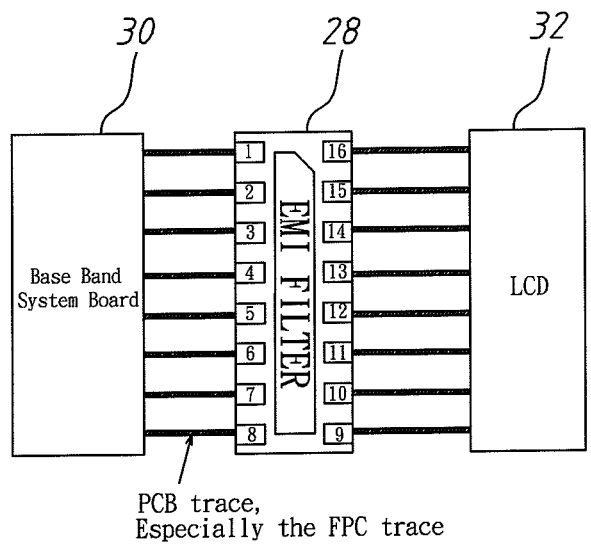
FIG. 4 is a sample application diagram schematically showing a traditional Electromagnetic Disturbance (EMI) filter.
Figure 5:
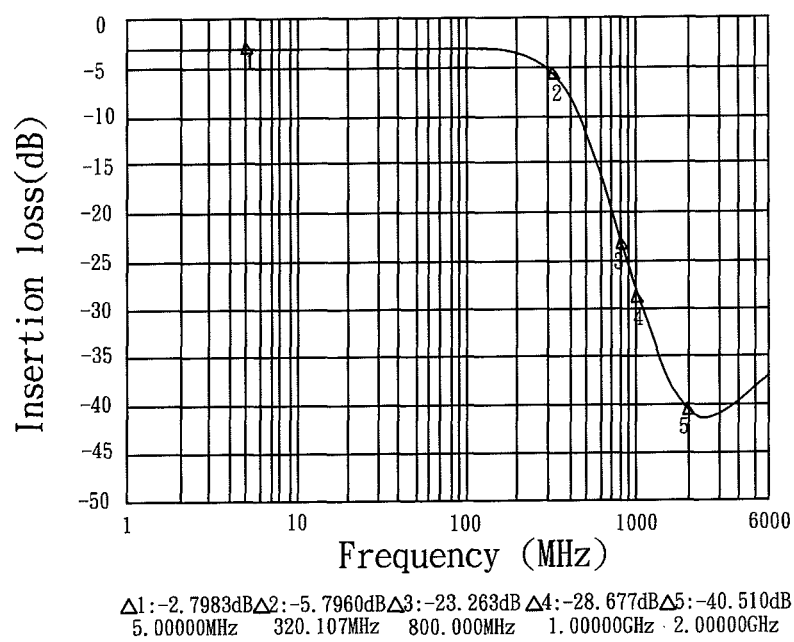
FIG. 5 is a diagram showing the typical filter insertion loss curve of the CLC type LPF shown in FIG. 3.
Figure 6A:
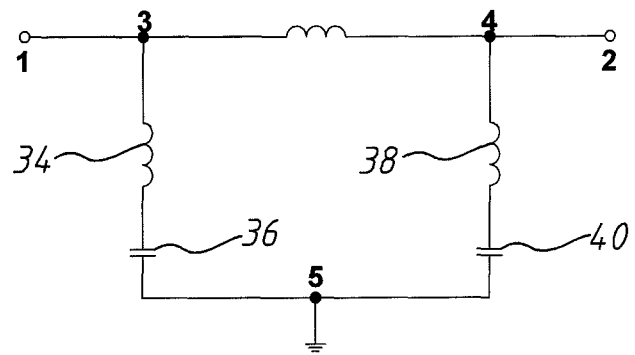
FIG. 6(a) is a diagram schematically showing a CLC type LPF circuit using two L-C tanks at input and output ports according to an embodiment of the present invention.
Figure 6B:
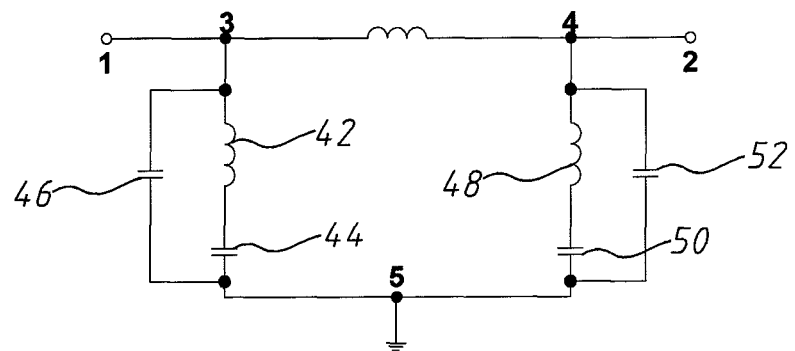
FIG. 6(b) is a diagram schematically showing a CLC type LPF circuit using two L-C-C tanks at input and output ports according to an embodiment of the present invention.

In the first embodiment, the present invention aims to improve the conventional CLC type filter shown in FIG. 3, which is depicted in FIG. 6 for its conceptual circuitry. The new filter circuit utilizes a special LC resonance tank at both signal input and output nodes of the conventional 2-port CLC filter circuit to improve the rejection band attenuation though careful frequency compensation. In one example schematic shown in FIG. 6(a), a new L-C tank consisting of an inductor 34 and a capacitor 36 is connected between Node-3 and Node-5, while a new L-C tank consisting of an inductor 38 and a capacitor 40 is connected between Node-4 and Node-5. Alternatively, FIG. 6(b) illustrates a similar new circuit using a first L-C-C tank and a second L-C-C tank at the input and output ports of the CLC LPF circuit, respectively. The first L-C-C tank consists of an inductor 42 and two capacitors 44 and 46, and the second L-C-C tank consists of an inductor 48 and two capacitors 50 and 52. Through accurate frequency compensation using the integrated LC tanks, the rejection band attenuation can be significantly improved by carefully design of the LC resonant frequency of the new circuit.

Figure 7:
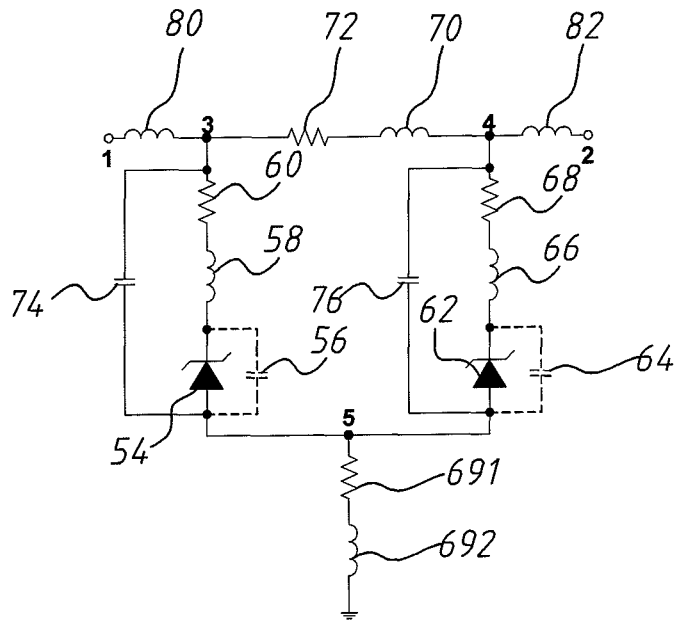
FIG. 7 is a diagram schematically showing a CLC type LPF circuit according to the first embodiment of the present invention.

Refer to FIG. 7. The first embodiment of the present invention is described as below. The present invention comprises a first diode 54. The first diode 54 can induce a first parasitic capacitance 56 between the first cathode and the first anode of the first diode 54. The first cathode is coupled to a first inductor 58 having a first series resistance 60. A second diode 62 can induce a second parasitic capacitance 64 coupled between the second cathode and the second anode of the second diode 62. The second cathode is coupled to a second inductor 66 having a second series resistance 68. The first and second anodes are coupled to the ground through a parasitic resistance 691 and a first parasitic inductor 692 connected in series and associated with bonding and package of the filter. A first passive element is coupled between the first and second inductors 58 and 66. In the first embodiment, the first passive element is exemplified by an inductor 70 with a series resistance 72. A first node is placed between the inductor 70 and the first inductor 58, and a second node is placed between the inductor 70 and the second inductor 66. The first inductor 58, the second inductor 66, and the inductor 70 can induce a third parasitic capacitance 74 between the first node and the first anode and a fourth parasitic capacitance 76 between the second node and the second anode. Besides, the first node is coupled to a first port through a second parasitic inductor 80 associated with bonding and package of the filter; and the second node is coupled to a second port through a third parasitic inductor 82 associated with bonding and package of the filter.

Figure 8:
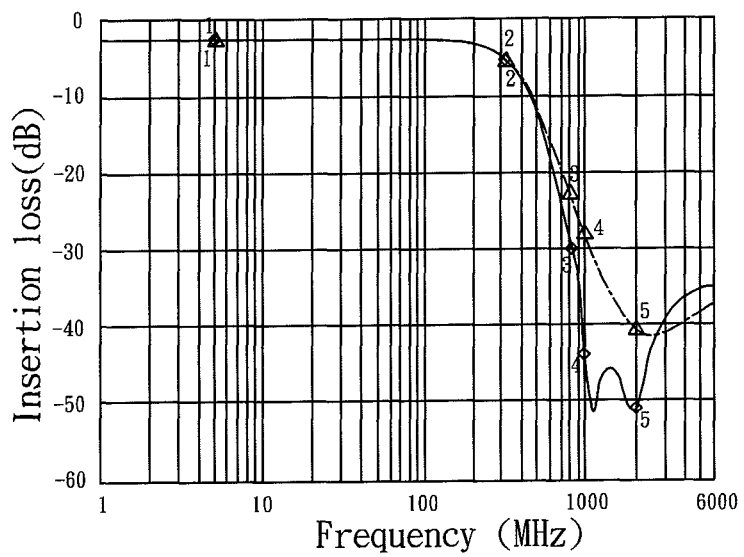
FIG. 8 is a diagram showing the insertion loss curve comparison for the CLC type LPFs shown in FIG. 3 and FIG. 7 according to an embodiment of the present invention.

FIG. 8 gives the insertion loss $S_{21}$ curves for two typical LPF circuits in FIG. 3 and FIG. 7, which clearly shows the significant improvement in all critical specs by using the new circuit technique in the present invention. Specifically, the rejection-band attenuation is enhanced to −30 dB while keeping $f_c$=320 MHz for broad pass-band. In actual design, the values for the first parasitic capacitance 56, the first inductor 58, the third parasitic capacitance 74, the second parasitic capacitance 64, the second inductor 66 and the parasitic resistance 76, etc., ought to be selected rationally to purposely create the required frequency resonant points, as observed in FIG. 8, which serves to achieve a wider high-attenuation rejection bandwidth with sharp roll-off curve as desired.

Figure 9:
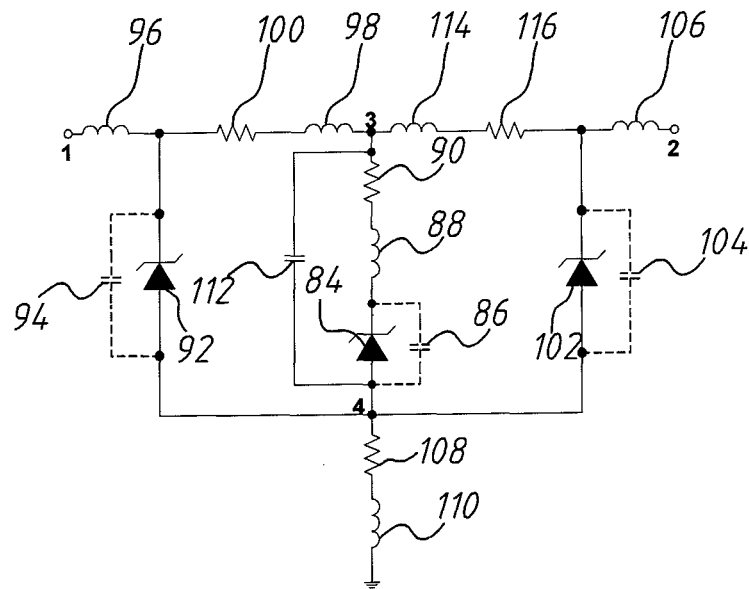
FIG. 9 is a diagram schematically showing a CLC type LPF circuit according to the second embodiment of the present invention.

Refer to FIG. 9. The second embodiment of the present invention is described as below. The present invention comprises a first diode 84. The first diode 84 can induce a first parasitic capacitance 86 between the first cathode and the first anode of the first diode 84. The first cathode is coupled to an inductor 88 having a series resistance 90. A second diode 92 can induce a second parasitic capacitance 94 between the second cathode and the second anode of the second diode 92. The second cathode is coupled to a first port through a second parasitic inductor 96 associated with bonding and package of the filter. A first passive element is coupled between the second cathode and the inductor 88. In the second embodiment, the first passive element is exemplified by an inductor 98 with a series resistance 100. A third diode 102 can induce a third parasitic capacitance 104 between the third cathode and the third anode of the third diode 102. The third cathode is coupled to a second port through a third parasitic inductor 106 associated with bonding and package of the filter. The first, second and third anodes are coupled to the ground through a parasitic resistance 108 and a first parasitic inductor 110 connected in series and associated with bonding and package of the filter. A second passive element is coupled between the third cathode and the inductor 88 and cooperates with the inductor 98 and the inductor 88 to induce a fourth parasitic capacitance 112 between the first anode and a node among the second passive element, and the inductors 88 and 98. In the second embodiment, the second passive element is exemplified by an inductor 114 with a series resistance 116.

Figure 10:
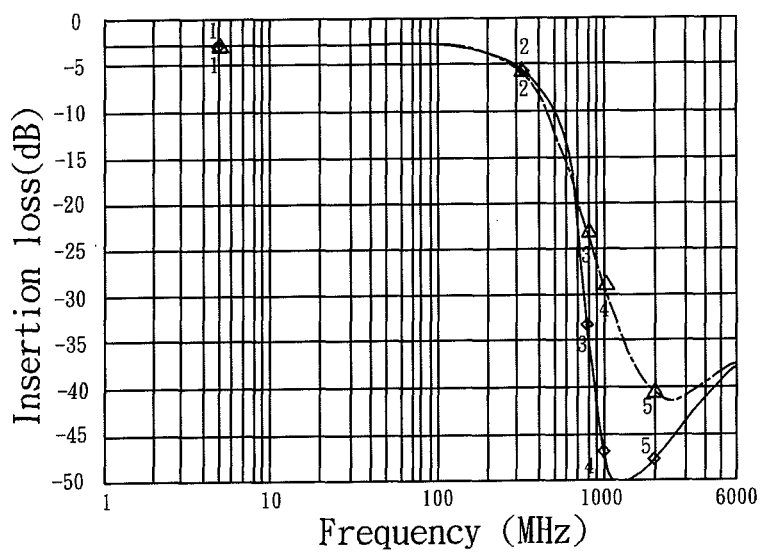
FIG. 10 is a diagram showing the insertion loss curve comparison for the CLC type LPFs shown in FIG. 3 and FIG. 9 according to an embodiment of the present invention.

FIG. 10 shows that the rejection-band attenuation performance of this new LPF filter circuit improves significantly over the conventional circuit, i.e., $f_c$=328 MHz, a steeper roll-off curve from the pass-band to the rejection-band and much higher rejection-band attenuation (−33 dB @ 800 MHz vs. −23 dB @ 800 MHz, −47 dB @ 1 GHz vs. −28 dB @ 1 GHz, and −48 dB @ 2 GHz vs. −40 dB @ 2 GHz). Meanwhile, the second embodiment schematic helps to prevent possible inductor induced overshot in the voltage clamping voltage during ESD stressing.

Figure 11:
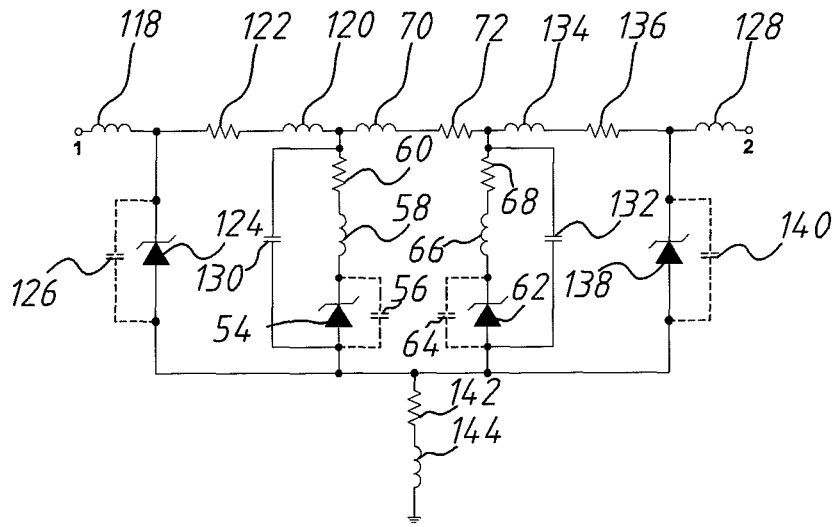
FIG. 11 is a diagram schematically showing a CLC type LPF circuit according to the third embodiment of the present invention.

Refer to FIG. 11. The third embodiment of the present invention is described as below. The present invention comprises a first diode 54. The first diode 54 can induce a first parasitic capacitance 56 between the first cathode and the first anode of the first diode 54. The first cathode is coupled to a first inductor 58 having a first series resistance 60. A second diode 62 can induce a second parasitic capacitance 64 coupled between the second cathode and the second anode of the second diode 62. The second cathode is coupled to a second inductor 66 having a second series resistance 68. A first passive element is coupled between the first and second inductors 58 and 66. In the third embodiment, the first passive element is exemplified by an inductor 70 with a series resistance 72. A first node is placed between the inductor 70 and the first inductor 58, and a second node is placed between the inductor 70 and the second inductor 66.

A second passive element has two ends. One end is coupled to the first node, and another end is coupled to a second parasitic inductor 118 associated with bonding and package of the filter and a first port in order. The second passive element is coupled between the first node and the second parasitic inductor 118. The second passive element is exemplified by an inductor 120 with a series resistance 122. The third cathode of a third diode 124 is coupled to a third node between the second parasitic inductor 118 and the inductor 120, and the third diode 124 can induce a fifth parasitic capacitance 126 between the third cathode and the third anode of the third diode 124. A third passive element has two ends. One end is coupled to the second node, and another end is coupled to a third parasitic inductor 128 associated with bonding and package of the filter and a second port in order. The third passive element is coupled between the second node and the third parasitic inductor 128 and cooperates with the first inductor 58, the second inductor 66, the inductors 70 and 120 to induce a third parasitic capacitance 130 between the first node and the first anode and a fourth parasitic capacitance 132 between the second node and the second anode. The third passive element is exemplified by an inductor 134 with a series resistance 136. The fourth cathode of a fourth diode 138 is coupled to a fourth node between the third parasitic inductor 128 and the inductor 134. The fourth diode 138 can induce a sixth parasitic capacitance 140 between the fourth cathode and the fourth anode. Besides, the first, second, third, and fourth anodes are coupled to the ground through a parasitic resistance 142 and a first parasitic inductor 144 connected in series and associated with bonding and package of the filter.

Figure 12:
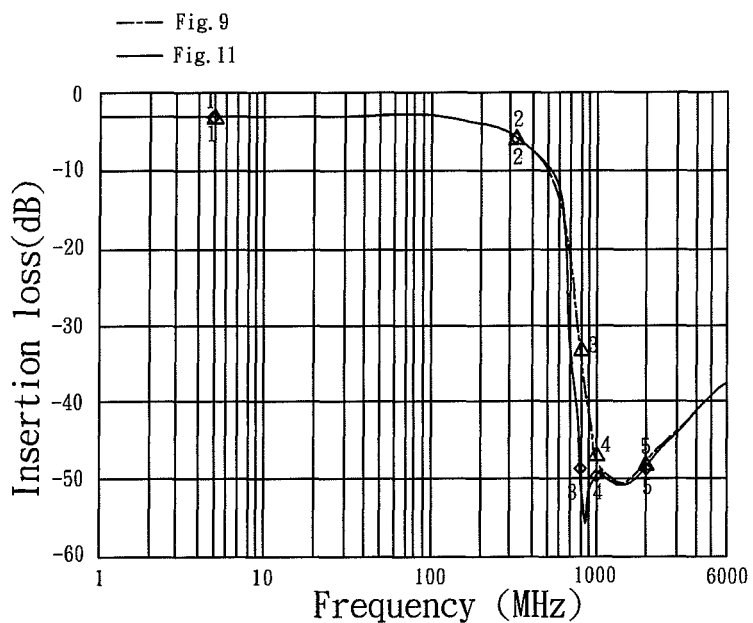
FIG. 12 is a diagram showing the insertion loss curve comparison for the CLC type LPFs shown in FIG. 9 and FIG. 11 according to an embodiment of the present invention.

In the third embodiment, the invention results in new higher-order LPF filter circuit schematics utilizing several parallel frequency resonant LC tanks in a distributed network format. FIG. 11 illustrates one of such high-order LPF filter with two LC resonance tanks originated from that in FIG. 9. Such higher-order distributed LC resonance tank based LPF circuit allows very fine-tune in frequency compensation and therefore can further improve the RF filter performance including the critical rejection-band attenuation. FIG. 12 gives the $S_{21}$ curve comparison of the new filter circuit shown in FIG. 11 and the one illustrated in FIG. 9, which clearly shows RF performance improvement, particularly the much steeper roll-off rate to excellent rejection band.

Figure 13:
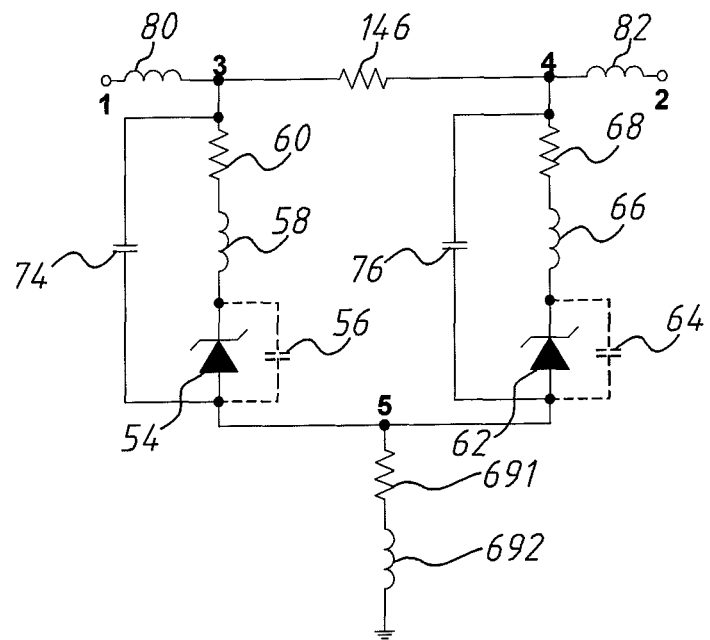
FIG. 13 is a diagram schematically showing a CRC type LPF circuit according to the fourth embodiment of the present invention.
Figure 14:
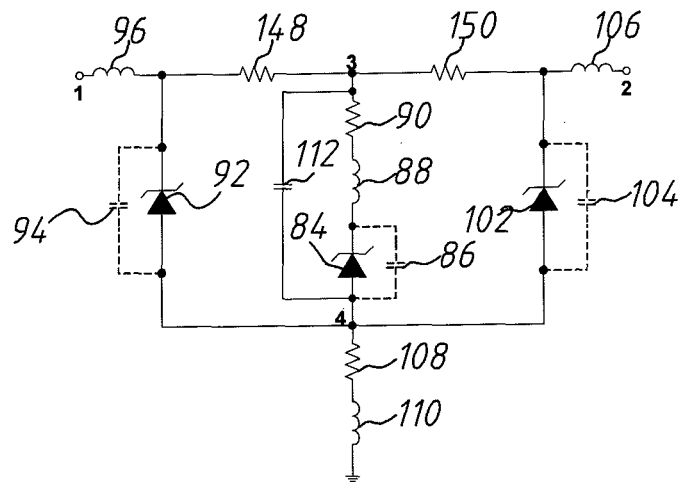
FIG. 14 is a diagram schematically showing a CRC type LPF circuit according to the fifth embodiment of the present invention.
Figure 15:
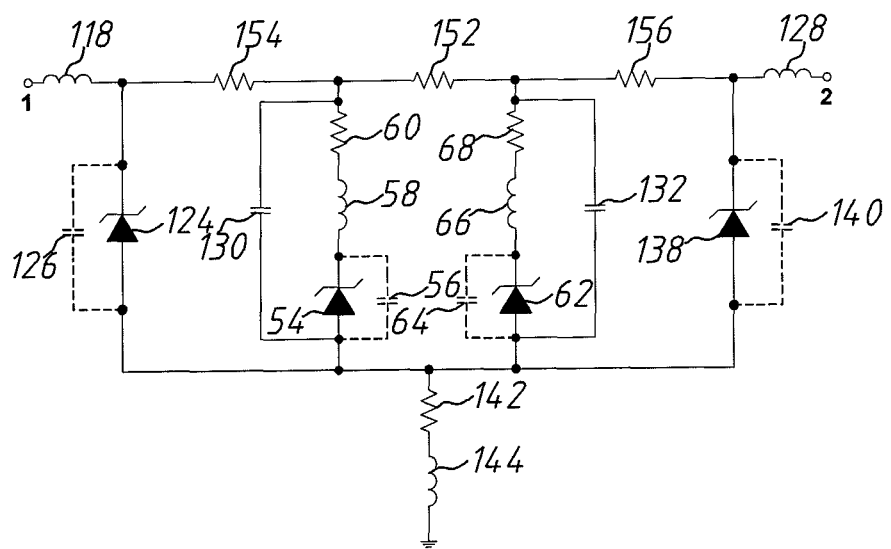
FIG. 15 is a diagram schematically showing a CRC type LPF circuit according to the sixth embodiment of the present invention.

In addition to the CLC LPF filters discussed previously, the new circuit techniques can be easily applied to any CRC type LPF circuits as well. Furthermore, they can be readily applied to any combined CLC and CRC mixed type filter circuits. For example, FIG. 13 is the fourth embodiment of the present invention. The fourth embodiment is different from the first embodiment in the first passive element. In the fourth embodiment, the first element is exemplified by a resistor 146. The first inductor 58, the second inductor 66, and the resistor 146 can induce a third parasitic capacitance 74 and a fourth parasitic capacitance 76. In addition, FIG. 14 and FIG. 15 are respectively the fifth and sixth embodiments of the present invention. By the same token, the fifth embodiment is different from the second embodiment in the first and second passive elements. In the fifth embodiment, the first and second elements are respectively exemplified by resistors 148 and 150. The resistors 148 and 150 and the inductor 88 can induce a fourth parasitic capacitance 112. The sixth embodiment is different from the third embodiment in the first, second and third passive elements. In the sixth embodiment, the first, second and third elements are respectively exemplified by resistors 152, 154 and 156. The resistors 152, 154 and 156, the first inductor 58, and the second inductor 66 can induce a third parasitic capacitance 130 and a fourth parasitic capacitance 132. These new CRC filter circuits utilizing the new resonant LC tank technique achieves superior rejection-band RF performance over its conventional counterpart.

In conclusion, the present invention uses the LC tank method to achieve excellent filter circuit performance.

The embodiments described above are only to exemplify the present invention but not to limit the scope of the present invention. Therefore, any equivalent modification or variation according to the shapes, structures, characteristics and spirit of the present invention is to be also included within the scope of the present invention.

What is claimed is:

1. An integrated circuit (IC) electromagnetic interference (EMI) filter with electrostatic discharge (ESD) protection incorporating inductor-capacitor (LC) resonance tanks, said IC EMI filter comprising:
   a first diode with a first anode thereof coupled to a ground, wherein said first diode comprises a first parasitic capacitance between a first cathode of said first diode and said first anode;
   a first inductor having a first series resistance, and being coupled to said first cathode;
   a second diode with a second anode thereof coupled to said ground, wherein said second diode comprises a second parasitic capacitance between a second cathode of said second diode and said second anode;
   a second inductor having a second series resistance, and being coupled to said second cathode; and
   a first passive element coupled between said first and second inductors, wherein a first node between said first passive element and said first inductor is coupled to a first port, and a second node between said first passive element and said second inductor is coupled to a second port.

2. The IC EMI filter of claim 1, wherein:
   said first and second anodes are coupled to said ground through a parasitic resistance and a first parasitic inductor that are associated with bonding and package;
   said first node is coupled to said first port through a second parasitic inductor that is associated with said bonding and package; and
   said second node is coupled to said second port through a third parasitic inductor that is associated with said bonding and package.

3. The IC EMI filter of claim 1, wherein said first passive element comprises at least one of a resistor and an inductor with a series resistance.

4. The IC EMI filter of claim 1, further comprising:
   a second passive element coupled between said first node and said first port;
   a third diode with a third cathode thereof coupled to a third node between said first port and said second passive element, and a third anode thereof coupled to said ground, wherein said third diode comprises a fifth parasitic capacitance between said third cathode and said third anode;
   a third passive element coupled between said second node and said second port and cooperating with said first and second inductors and said first and second passive elements to induce third and fourth parasitic capacitances; and
   a fourth diode with a fourth cathode thereof coupled to a fourth node between said second port and said third passive element, and a fourth anode thereof coupled to said ground, wherein said fourth diode comprises a sixth parasitic capacitance between said fourth cathode and said fourth anode.

5. The IC EMI filter of claim 4, wherein:
   said first, second, third, and fourth anodes are coupled to said ground through a parasitic resistance and a first parasitic inductor that are associated with bonding and package;
   said third node is coupled to said first port through a second parasitic inductor that is associated with said bonding and package; and
   said fourth node is coupled to said second port through a third parasitic inductor that is associated with said bonding and package.

6. The IC EMI filter of claim 4, wherein each of said second and third passive elements comprises an inductor with a series resistance.

7. The IC EMI filter of claim 4, wherein each of said second and third passive elements comprises a resistor.

8. An integrated circuit (IC) electromagnetic interference (EMI) filter with electrostatic discharge (ESD) protection incorporating inductor-capacitor (LC) resonance tanks, said IC EMI filter comprising:
   a first diode with a first anode thereof coupled to a ground, wherein said first diode comprises a first parasitic capacitance between a first cathode of said first diode and said first anode;
   an inductor having a series resistance, and being coupled to said first cathode;
   a second diode with a second anode thereof coupled to said ground, wherein said second diode comprises a second parasitic capacitance between a second cathode of said second diode and said second anode, and wherein said second cathode is coupled to a first port;
   a first passive element coupled between said second cathode and said inductor;
   a third diode with a third anode thereof coupled to said ground, wherein said third diode comprises a third parasitic capacitance between a third cathode of said third diode and said third anode, and wherein said third cathode is coupled to a second port; and
   a second passive element coupled between said third cathode and said inductor.

9. The IC EMI filter of claim 8, wherein:
   said first, second and third anodes are coupled to said ground through a parasitic resistance and a first parasitic inductor that are associated with bonding and package;
   said second cathode is coupled to said first port through a second parasitic inductor that is associated with said bonding and package; and
   said third cathode is coupled to said second port through a third parasitic inductor that is associated with said bonding and package.

10. The IC EMI filter of claim 8, wherein each of said first and second passive elements comprises an inductor with a series resistance.

11. The IC EMI filter of claim 8, wherein each of said first and second passive elements comprises a resistor.

* * * * *